US011446766B2

(12) United States Patent
Rockstroh et al.

(10) Patent No.: US 11,446,766 B2
(45) Date of Patent: Sep. 20, 2022

(54) LAYERED MANUFACTURING OF SINGLE CRYSTAL ALLOY COMPONENTS

(71) Applicant: General Electric Company, Schenectady, NY (US)

(72) Inventors: Todd Jay Rockstroh, Cincinnati, OH (US); Michael Francis Xavier Gigliotti, Niskayuna, NY (US); William Thomas Carter, Niskayuna, NY (US); David Henry Abbott, Cincinnati, OH (US); Rajendra Madhukar Kelkar, Cincinnati, OH (US)

(73) Assignee: General Electric Company

( * ) Notice: Subject to any disclaimer, the term of this patent is extended or adjusted under 35 U.S.C. 154(b) by 141 days.

(21) Appl. No.: 16/798,505

(22) Filed: Feb. 24, 2020

(65) Prior Publication Data
US 2020/0298341 A1    Sep. 24, 2020

Related U.S. Application Data

(63) Continuation of application No. 15/036,456, filed as application No. PCT/US2014/065205 on Nov. 12, 2014, now Pat. No. 10,569,362.
(Continued)

(51) Int. Cl.
*B33Y 30/00*     (2015.01)
*B23K 26/34*     (2014.01)
(Continued)

(52) U.S. Cl.
CPC ............ *B23K 26/342* (2015.10); *B22F 10/20* (2021.01); *B23K 26/0853* (2013.01);
(Continued)

(58) Field of Classification Search
CPC ........... B22F 3/003; H05B 69/16; H05B 6/22; H05B 6/16; B23K 26/06; B23K 26/08;
(Continued)

(56) References Cited

U.S. PATENT DOCUMENTS

| 818,191 A | 4/1906 | Ramsaier |
| 4,758,157 A | 7/1988 | Hailey |

(Continued)

FOREIGN PATENT DOCUMENTS

| CN | 1542173 A | 11/2004 |
| CN | 101649844 A | 2/2010 |

(Continued)

OTHER PUBLICATIONS

Canadian Office Action Corresponding to CA2930572 dated Dec. 15, 2017.
(Continued)

*Primary Examiner* — Michael A Laflame, Jr.
(74) *Attorney, Agent, or Firm* — Dinsmore & Shohl LLP

(57) ABSTRACT

A method of making a component includes: depositing a metallic powder on a workplane; directing a beam from a directed energy source to fuse the powder in a pattern corresponding to a cross-sectional layer of the component; repeating in a cycle the steps of depositing and fusing to build up the component in a layer-by layer fashion; and during the cycle of depositing and melting, using an external heat control apparatus separate from the directed energy source to maintain a predetermined temperature profile of the component, such that the resulting component has a directionally-solidified or single-crystal microstructure.

5 Claims, 5 Drawing Sheets

Related U.S. Application Data

(60) Provisional application No. 61/904,183, filed on Nov. 14, 2013.

(51) Int. Cl.

| | | |
|---|---|---|
| *B23K 26/342* | (2014.01) | |
| *C30B 29/52* | (2006.01) | |
| *B33Y 10/00* | (2015.01) | |
| *C30B 11/00* | (2006.01) | |
| *B22F 10/20* | (2021.01) | |
| *B33Y 80/00* | (2015.01) | |
| *B23K 26/144* | (2014.01) | |
| *B23K 26/70* | (2014.01) | |
| *B23K 26/08* | (2014.01) | |
| *C30B 11/02* | (2006.01) | |
| *C30B 28/06* | (2006.01) | |
| *H05B 3/00* | (2006.01) | |
| *H05B 6/10* | (2006.01) | |
| *B22F 10/30* | (2021.01) | |

(52) U.S. Cl.
CPC ........ *B23K 26/0869* (2013.01); *B23K 26/144* (2015.10); *B23K 26/702* (2015.10); *B33Y 10/00* (2014.12); *B33Y 30/00* (2014.12); *B33Y 80/00* (2014.12); *C30B 11/00* (2013.01); *C30B 11/003* (2013.01); *C30B 11/005* (2013.01); *C30B 11/02* (2013.01); *C30B 28/06* (2013.01); *C30B 29/52* (2013.01); *H05B 3/0061* (2013.01); *H05B 6/101* (2013.01); *B22F 10/30* (2021.01); *F05D 2220/32* (2013.01); *F05D 2230/31* (2013.01); *F05D 2240/24* (2013.01); *F05D 2300/175* (2013.01); *Y02P 10/25* (2015.11)

(58) Field of Classification Search
CPC ........... B23K 26/34–348; B33Y 10/00; B33Y 30/00; B33Y 40/00
See application file for complete search history.

(56) References Cited

U.S. PATENT DOCUMENTS

| | | | |
|---|---|---|---|
| 4,874,312 A | 10/1989 | Hailey | |
| 6,031,207 A | 2/2000 | Dover et al. | |
| 6,049,978 A | 4/2000 | Arnold | |
| 6,355,086 B2 | 3/2002 | Brown et al. | |
| 6,515,382 B1 | 2/2003 | Ullakko | |
| 6,621,039 B2 | 9/2003 | Wang et al. | |
| 7,043,819 B1 | 5/2006 | Arnold | |
| 7,810,237 B2 | 10/2010 | Lange et al. | |
| 8,123,489 B2 | 2/2012 | Udall et al. | |
| 8,142,874 B1 | 3/2012 | Jefferson et al. | |
| 8,347,940 B2 | 1/2013 | Furlong et al. | |
| 8,784,721 B2 | 7/2014 | Philippi et al. | |
| 9,011,982 B2 | 4/2015 | Muller et al. | |
| 9,744,723 B2 | 8/2017 | Baumann et al. | |
| 10,201,853 B2 | 2/2019 | Retze et al. | |
| 10,285,222 B2 | 5/2019 | Jakimov et al. | |
| 2003/0197295 A1 | 10/2003 | Nakai et al. | |
| 2004/0056022 A1 | 3/2004 | Meiners et al. | |
| 2005/0268988 A1 | 12/2005 | Cavallari | |
| 2005/0268998 A1 | 12/2005 | Bostanjoglo et al. | |
| 2006/0054079 A1 | 3/2006 | Withey et al. | |
| 2006/0121196 A1 | 6/2006 | Tanaka | |
| 2007/0057412 A1 | 3/2007 | Weiskopf et al. | |
| 2008/0131104 A1 | 6/2008 | Philippi | |
| 2009/0246739 A1* | 10/2009 | Jussel .................. H05B 6/806 219/412 |
| 2009/0283501 A1 | 11/2009 | Erikson et al. | |
| 2010/0028158 A1 | 2/2010 | Richter | |
| 2010/0151145 A1 | 6/2010 | Richter et al. | |
| 2011/0135952 A1 | 6/2011 | Morris et al. | |
| 2011/0171398 A1 | 7/2011 | Oladeji | |
| 2011/0217457 A1 | 9/2011 | Huttner et al. | |
| 2011/0311389 A1 | 12/2011 | Ryan et al. | |
| 2012/0213659 A1 | 8/2012 | Bayer et al. | |
| 2012/0222306 A1 | 9/2012 | Mittendorf et al. | |
| 2012/0237745 A1 | 9/2012 | Dierkes et al. | |
| 2013/0001837 A1 | 1/2013 | Goehler et al. | |
| 2013/0004680 A1 | 1/2013 | Godfrey et al. | |
| 2013/0195673 A1 | 8/2013 | Godfrey et al. | |
| 2013/0287590 A1 | 10/2013 | Neuhaeusler et al. | |
| 2014/0239553 A1 | 8/2014 | Bamberg et al. | |
| 2014/0263577 A1* | 9/2014 | Simpson ............... B23K 1/0018 228/103 |
| 2015/0129583 A1* | 5/2015 | Richter .................. B22F 10/20 219/601 |
| 2015/0306820 A1* | 10/2015 | Colin .................... B29C 64/153 219/76.12 |
| 2016/0074965 A1 | 3/2016 | Jakimov et al. | |
| 2016/0368052 A1 | 12/2016 | Jakimov et al. | |
| 2017/0056975 A1 | 3/2017 | Carter et al. | |
| 2017/0072643 A1* | 3/2017 | Ng ........................ B29C 64/232 |
| 2017/0297101 A1* | 10/2017 | Casper .................... B22F 5/009 |
| 2021/0213536 A1* | 7/2021 | Mottin ................. B23K 26/342 |

FOREIGN PATENT DOCUMENTS

| | | |
|---|---|---|
| DE | 3248134 A1 | 7/1983 |
| DE | 10104732 C1 | 6/2002 |
| DE | 60114453 T2 | 7/2006 |
| DE | 2006058949 A1 | 6/2008 |
| DE | 102007036370 B3 | 10/2008 |
| DE | 102007056984 A1 | 5/2009 |
| DE | 102008012063 A1 | 9/2009 |
| DE | 102009020987 A1 | 11/2010 |
| DE | 102009050563 A1 | 1/2011 |
| DE | 102009048665 A1 | 3/2011 |
| DE | 102010004035 A1 | 7/2011 |
| DE | 102010050531 A1 | 3/2012 |
| DE | 102012012344 A1 | 9/2013 |
| DE | 102012206122 A1 | 10/2013 |
| DE | 102014108061 A1 | 12/2014 |
| DE | 102013213260 A1 | 1/2015 |
| EP | 1637274 A1 | 3/2006 |
| EP | 1983160 A2 | 10/2008 |
| EP | 2319641 A1 | 5/2011 |
| EP | 2565294 A1 | 3/2013 |
| EP | 2572815 A1 | 3/2013 |
| EP | 2620240 A1 | 7/2013 |
| EP | 2789413 A1 | 10/2014 |
| EP | 2106337 B2 | 6/2016 |
| WO | WO2010/088069 A2 | 8/2010 |
| WO | WO2011/020912 A2 | 2/2011 |
| WO | WO2013/087515 A1 | 6/2013 |
| WO | WO2015/119694 A2 | 8/2015 |

OTHER PUBLICATIONS

Chinese Office Action Corresponding to CN2014800623369 dated Nov. 22, 2016.
European Search Report Corresponding to EP161856158 dated Feb. 1, 2017.
Japanese Notification of Refusal Corresponding to JP2016-529883 dated May 23, 2017.
PCT International Search Report Corresponding to PCT/US2014/065205 dated Aug. 26, 2015.
PCT International Search Report & Opinion Corresponding to PCT/US2014/065215 dated Sep. 4, 2015.
Das et al., Direct Laser Fabrication of Superalloy Cermet Abrasive Turbine Blade Tips, Materials & Design, vol. 21, Issue 2, April 1, 2000, pp. 63-73.
Gebhardt, Rapid Prototyping-Rapid Tooling-Rapid Manufacturing, Generative Fertigungsverfahren, 3$^{rd}$ Edition, Hanser Verlag München, 2007, Refer to pp. 121 and 122.
Guo et al., Additive Manufacturing: Technology, Applications and Research Needs, Frontiers of Mechanical Engineering, vol. 8, Issue 3, Sep. 5, 2013, pp. 215-243.

(56) References Cited

OTHER PUBLICATIONS

Dissertation von Yves-Christian Hagedorn "Additive Manufacturing of High Performance Oxide Ceramics via Selective Laser Melting", veroffentlicht am 26. Aug. 2013.
"Cladding (metalworking)" Wikipedia Definition "https://en.wikipedia.org/w/index.php?title=Cladding_(metalworking)&oldid=945244573" Mar. 2020.
Notice of Opposition to EP Patent 3068929 filed Oct. 17, 2018 (27 pages).
Notice of Opposition to EP Patent 3068929 filed Oct. 17, 2018 (20 pages).
Written Submission in preparation to/during oral proceedings dated Jul. 1, 2020 for EP Patent 3068929 (10 pages).
Written Submission in Response to Auxilary Requests filed May 22, 2019, dated Jul. 9, 2020 for EP Patent 3068929 (13 pages).
Written Submission in Response to Auxilary Requests filed May 22, 2019, dated Jul. 24, 2020 for EP Patent 3068929 (41 pages).
Official Communication from Eurporean Patent Office dated Aug. 11, 2020 and statement by Opponent 1 dated Aug. 6, 2020 for EP Patent 3068929. (4 pages).
Written Submission in Response to statement filed Aug. 6, 2020 for EP Patent 3068929, dated Aug. 19, 2020 for EP Patent 3068929. (4 pages).
Ground for the Decision—Annex, dated Nov. 20, 2020 for EP Patent 3068929. (21 pages).

\* cited by examiner

LAYERED MANUFACTURING OF SINGLE CRYSTAL ALLOY COMPONENTS

CROSS REFERENCE TO RELATED APPLICATIONS

This Application claims priority to, and is a continuation application of, U.S. patent application Ser. No. 15/036,456 filed May 13, 2016, which is a national stage application, filed under 35 U.S.C. § 371, of International Patent Application No. PCT/US2014/065205, filed on Nov. 12, 2014, which claims priority to U.S. Provisional Patent Application Ser. No. 61/904,183 filed Nov. 14, 2013, all of which are hereby expressly incorporated herein by reference in their entirety.

BACKGROUND OF THE INVENTION

This invention relates generally to turbine components, and more particularly to apparatus and methods for constructing single-crystal turbine components for use in high-temperature environments.

A typical gas turbine engine includes a turbomachinery core having a high pressure compressor, a combustor, and a high pressure turbine in serial flow relationship. The core is operable in a known manner to generate a primary gas flow. The high pressure turbine includes one or more stages which extract energy from the primary gas flow. Each stage comprises a stationary turbine nozzle followed by a downstream rotor carrying turbine blades. These "hot section" components operate in an extremely high temperature environment which promotes hot corrosion and oxidation of metal alloys.

In the prior art, hot section components are typically cast from nickel- or cobalt-based alloys having good high-temperature creep resistance, known conventionally as "superalloys." These alloys are primarily designed to meet mechanical property requirements such as creep rupture and fatigue strengths.

The casting process is known to produce desired microstructures, for example directionally solidified ("DS") or single-crystal ("SX"). A single-crystal microstructure refers to a structure which is free from crystallographic grain boundaries. Single crystal casting requires a seed element (that is, a nucleation point for cooling) and careful control of temperatures during cooling.

Additive manufacturing is an alternative process to casting, in which material is built up layer-by-layer to form a component. Unlike casting processes, additive manufacturing is limited only by the position resolution of the machine and not limited by requirements for providing draft angles, avoiding overhangs, etc. as required by casting. Additive manufacturing is also referred to by terms such as "layered manufacturing," "reverse machining," "direct metal laser melting" (DMLM), and "3-D printing." Such terms are treated as synonyms for purposes of the present invention.

Prior art techniques are known for using additive manufacturing to produce hot-section components. For example, U.S. Patent Application Publication 2011/013592 to Morris et al. describes a process in which a component is built up through repeated cycles of depositing metallic powder followed by laser melting. The laser heat input is sufficient to maintain required solutioning temperatures for a portion of a component, but cannot produce components having a single-crystal microstructure throughout.

Accordingly, there is a need for a process for additive manufacturing of components having a single-crystal microstructure.

BRIEF DESCRIPTION OF THE INVENTION

This need is addressed by the present invention, which provides an apparatus and method for layered manufacturing of single crystal alloy components. The apparatus and method incorporates the use of an external heat control apparatus effective to control the temperature of a component under construction.

According to one aspect of the invention, a method of making a component includes: depositing a metallic powder on a workplane; directing a beam from a directed energy source to fuse the powder in a pattern corresponding to a cross-sectional layer of the component; repeating in a cycle the steps of depositing and fusing to build up the component in a layer-by layer fashion; and during the cycle of depositing and melting, using an external heat control apparatus separate from the directed energy source to maintain a predetermined temperature profile of the component, such that the resulting component has a directionally-solidified or single-crystal microstructure.

According to another aspect of the invention, the powder and component are supported on a build platform which is moveable along a vertical axis.

According to another aspect of the invention, the method further includes lowering the build platform after each step of fusing the powder by a selected layer increment.

According to another aspect of the invention, the external heat control apparatus comprises a layer of thermal insulation surrounding the component.

According to another aspect of the invention, the external heat control apparatus comprises a heater surrounding the component.

According to another aspect of the invention, the external heat control apparatus comprises a quartz lamp positioned near the component.

According to another aspect of the invention, the external heat control apparatus comprises at least one induction coil surrounding the component.

According to another aspect of the invention, the external heat control apparatus is used to maintain the component at a solutioning temperature.

According to another aspect of the invention, the external heat control apparatus is used to control both the temperature and the heating rate of the component during the of depositing and fusing.

According to another aspect of the invention, an apparatus for making a metallic component includes: a build enclosure configured to hold metallic powder of a predetermined composition; a directed energy source operable to produce an energy beam suitable for fusing the metallic powder; a beam steering apparatus operable to direct the energy beam over the metallic powder in a pattern corresponding to a cross-sectional layer of the component; and an external heat control apparatus separate from the directed energy source operable to maintain a predetermined temperature profile within the build enclosure.

According to another aspect of the invention, the apparatus further includes a build platform disposed inside the build enclosure, the build platform being moveable along a vertical axis.

According to another aspect of the invention, the external heat control apparatus comprises a layer of thermal insulation surrounding the component.

According to another aspect of the invention, the external heat control apparatus comprises a heater surrounding the component.

According to another aspect of the invention, the external heat control apparatus comprises a quartz lamp positioned near the component.

According to another aspect of the invention, the external heat control apparatus comprises at least one induction coil surrounding the build enclosure.

According to another aspect of the invention, an induction coil is mounted above the build enclosure.

According to another aspect of the invention, the induction coil is mounted above the build enclosure by an arm connected to an actuator, wherein the actuator is operable to move the induction coil between an in-use position and a retracted position away from the build enclosure.

BRIEF DESCRIPTION OF THE DRAWINGS

The invention may be best understood by reference to the following description taken in conjunction with the accompanying drawing figures in which.

DETAILED DESCRIPTION OF THE INVENTION

Figure 1:
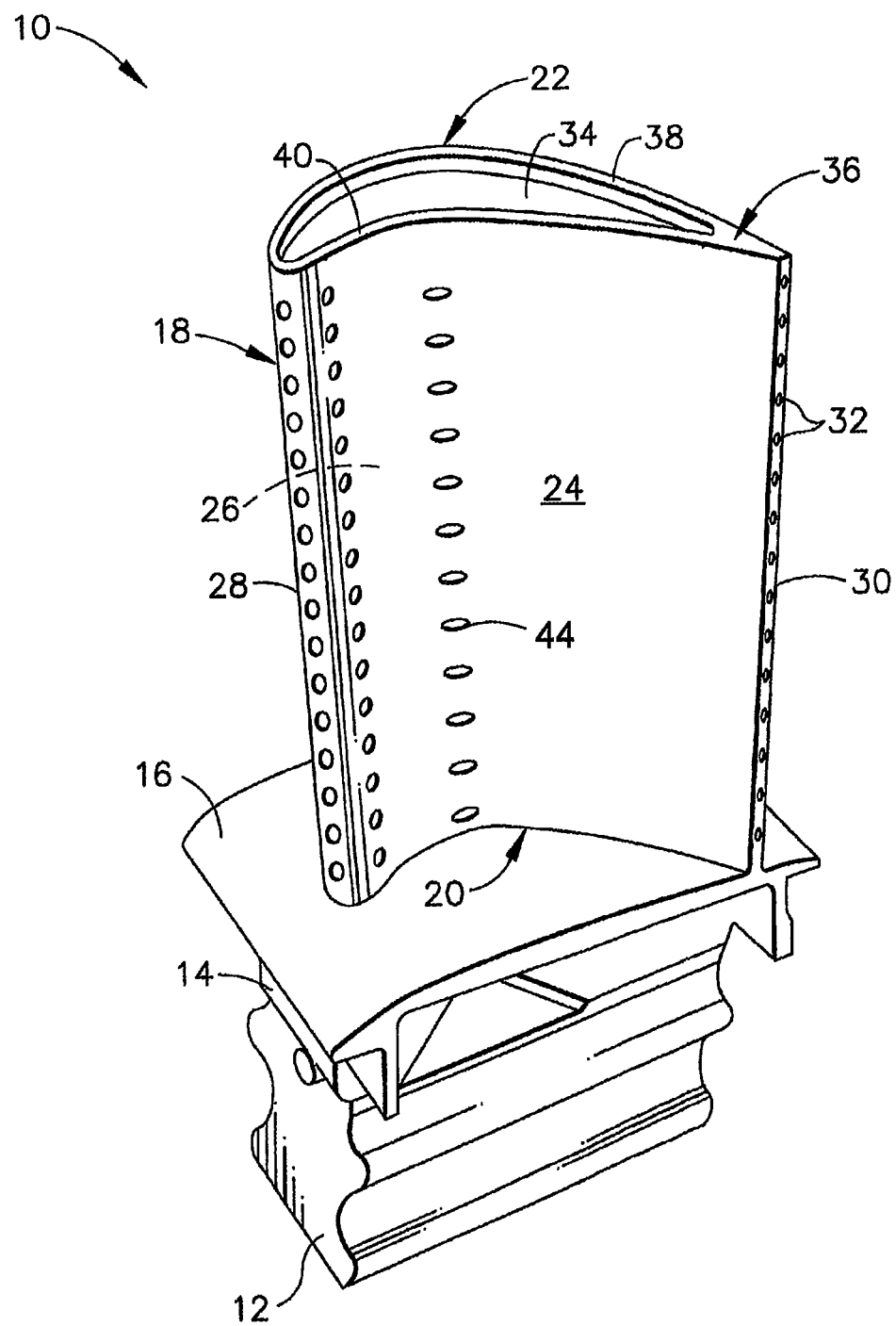
FIG. 1 is a schematic perspective view of an exemplary turbine component constructed in accordance with an aspect of the present invention.

Referring to the drawings wherein identical reference numerals denote the same elements throughout the various views, FIG. 1 illustrates an exemplary turbine blade 10. The turbine blade 10 includes a conventional dovetail 12, which may have any suitable form including tangs that engage complementary tangs of a dovetail slot in a rotor disk (not shown) for radially retaining the blade 10 to the disk as it rotates during operation. A blade shank 14 extends radially upwardly from the dovetail 12 and terminates in a platform 16 that projects laterally outwardly from and surrounds the shank 14. A hollow airfoil 18 extends radially outwardly from the platform 16 and into the hot gas stream. The airfoil has a root 20 at the junction of the platform 16 and the airfoil 18, and a tip 22 at its radially outer end. The airfoil 18 has a concave pressure side wall 24 and a convex suction side wall 26 joined together at a leading edge 28 and at a trailing edge 30. The airfoil 18 may take any configuration suitable for extracting energy from the hot gas stream and causing rotation of the rotor disk. The airfoil 18 may incorporate a plurality of trailing edge cooling holes 32, or it may incorporate a number of trailing edge bleed slots (not shown) on the pressure side wall 24 of the airfoil 18. The tip 22 of the airfoil 18 is closed off by a tip cap 34 which may be integral to the airfoil 18 or separately formed and attached to the airfoil 18. An upstanding squealer tip 36 extends radially outwardly from the tip cap 34 and is disposed in close proximity to a stationary shroud (not shown) in the assembled engine, in order to minimize airflow losses past the tip 22. The squealer tip 36 comprises a suction side tip wall 38 disposed in a spaced-apart relationship to a pressure side tip wall 40. The tip walls 40 and 38 are integral to the airfoil 18 and form extensions of the pressure and suction side walls 24 and 26, respectively. The outer surfaces of the pressure and suction side tip walls 40 and 38 respectively form continuous surfaces with the outer surfaces of the pressure and suction side walls 24 and 26. A plurality of film cooling holes 44 pass through the exterior walls of the airfoil 18. The film cooling holes 44 communicate with an interior space of the airfoil 18 (not shown), which may include a complex arrangement of cooling passageways defined by internal walls, such as a serpentine configuration.

In order to have sufficient creep rupture and fatigue strengths, and to resist hot corrosion and oxidation, the turbine blade 10 is made from a material such as a nickel- or cobalt-based alloy having good high-temperature creep resistance, known conventionally as "superalloys."

The present invention provides a method and apparatus for creating components having a single-crystal (SX) microstructure using an additive manufacturing method. The turbine blade 10 described above is only one example of numerous types of components that require such materials and microstructures, and which can be manufactured using the principles of the present invention. When describing the process and apparatus of the present invention, the term "component" will be used, designated "C".

Figure 2:
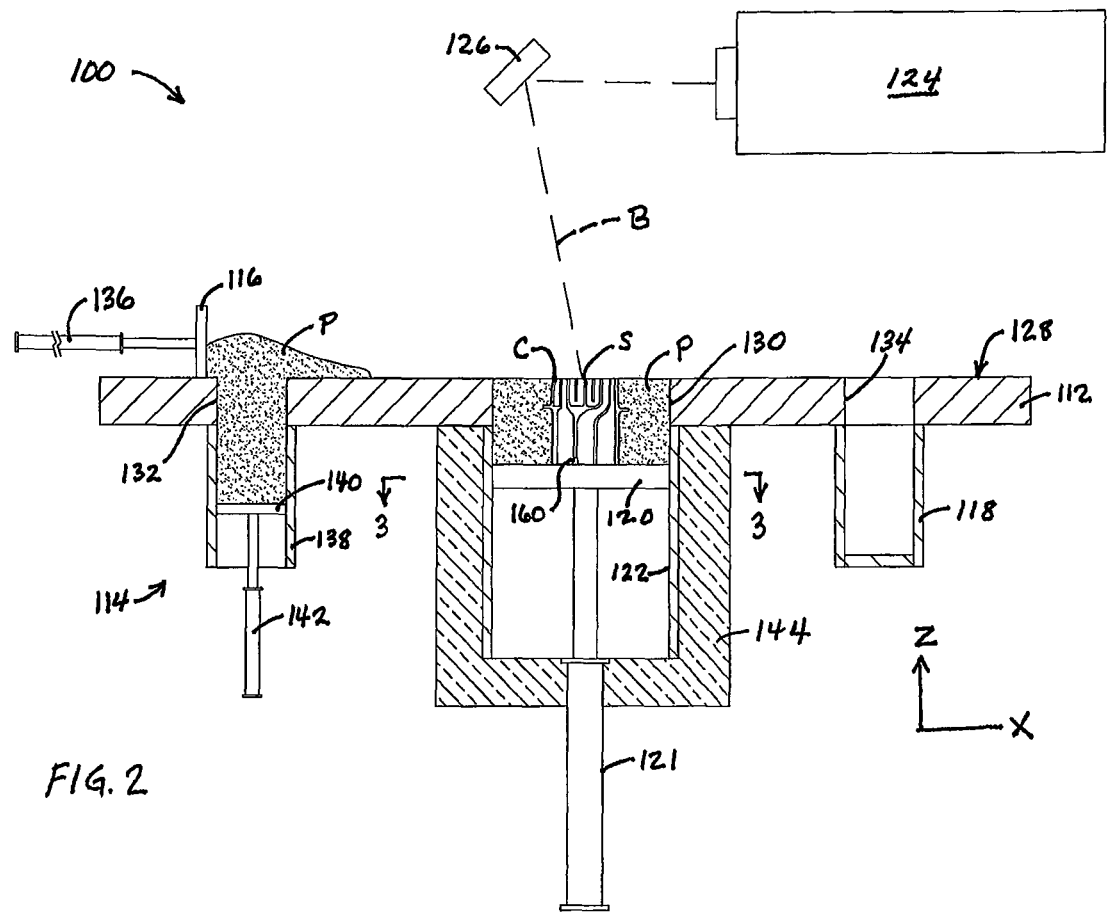
FIG. 2 is partially-sectioned schematic side view of an additive manufacturing apparatus constructed in accordance with an aspect of the present invention.

FIG. 2 illustrates schematically an apparatus 100 for carrying out the manufacturing method of the present invention. The basic components are a table 112, a powder supply 114, a scraper 116, an overflow container 118, a build platform 120 optionally surrounded by a build enclosure 122, a directed energy source 124, and a beam steering apparatus 126. Each of these components will be described in more detail below. The apparatus 100 also includes an external heat control apparatus which will be described below.

The table 112 is a rigid structure providing a planar worksurface 128. The worksurface 128 is coplanar with and defines a virtual workplane. In the illustrated example it includes a central opening 130 communicating with the build enclosure 122 and exposing the build platform 120, a supply opening 132 communicating with the powder supply 114, and an overflow opening 134 communicating with the overflow container 118.

The scraper 116 is a rigid, laterally-elongated structure that lies on the worksurface 128. It is connected to an actuator 136 operable to selectively move the scraper 116 along the worksurface 128. The actuator 136 is depicted schematically in FIG. 2, with the understanding devices such as pneumatic or hydraulic cylinders, ballscrew or linear electric actuators, and so forth, may be used for this purpose.

The powder supply 114 comprises a supply container 138 underlying and communicating with the supply opening, and an elevator 140. The elevator 140 is a plate-like structure that is vertically slidable within the supply container 138. It is connected to an actuator 142 operable to selectively move the elevator 140 up or down. The actuator 142 is depicted schematically in FIG. 2, with the understanding that devices such as pneumatic or hydraulic cylinders, ballscrew or linear electric actuators, and so forth, may be used for this purpose. When the elevator 140 is lowered, a supply of metallic powder "P" of a desired alloy composition may be loaded into the supply container 138. When the elevator 140 is raised, it exposes the powder P above the worksurface 128.

The build platform 120 is a plate-like structure that is vertically slidable below the central opening 130. It is connected to an actuator 121 operable to selectively move the build platform 120 up or down. The actuator 121 is depicted schematically in FIG. 2, with the understanding that devices such as pneumatic or hydraulic cylinders, ballscrew or linear electric actuators, and so forth, may be used for this purpose.

The overflow container 118 underlies and communicates with the overflow opening 134, and serves as a repository for excess powder P.

The directed energy source 124 may comprise any known device operable to generate a beam of suitable power and other operating characteristics to melt and fuse the metallic powder during the build process, described in more detail below. For example, the directed energy source 124 may be a laser having an output power density having an order of magnitude of about $10^4$ W/cm$^2$. Other directed-energy sources such as electron beam guns are suitable alternatives to a laser.

The beam steering apparatus 126 comprises one or more mirrors, prisms, and/or lenses and provided with suitable actuators, and arranged so that a beam "B" from the directed energy source 124 can be focused to a desired spot size and steered to a desired position in an X-Y plane coincident with the worksurface 128.

As used herein, the term "external heat control apparatus" refers to apparatus other than the directed energy source 124 which is effective to maintain a component C positioned on the build platform 120 at an appropriate solutioning temperature (i.e. to maintain a predetermined temperature profile) and therefore control the crystallographic properties of the solidifying powder P during the build process. As will be explained in more detail below, the external heat control apparatus may operate by acting directly as a source of heat (i.e. thermal energy input) or by retaining heat generated by the directed energy heating process. The external heat control apparatus is physically and functionally separate from the directed energy source 124.

Figure 3:
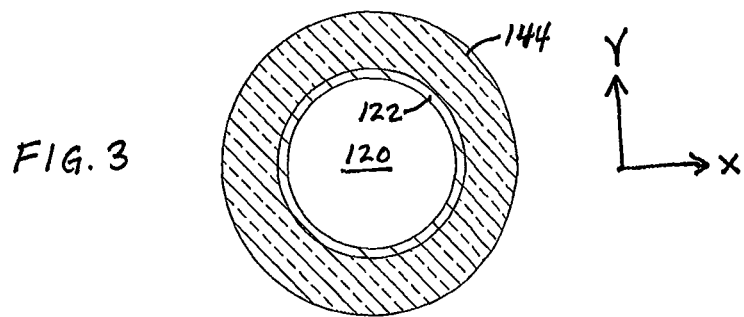
FIG. 3. is a view taken along lines 3-3 of FIG. 2.

Examples of various kinds of external heat control apparatus are shown in FIGS. 2-7. In FIGS. 2 and 3, a layer of thermal insulation 144 surrounds the build enclosure 122. The thermal insulation 144 is effective to impede heat transfer from the component C being built up, thereby reducing its cooling rate and maintaining elevated temperature.

Figure 4:
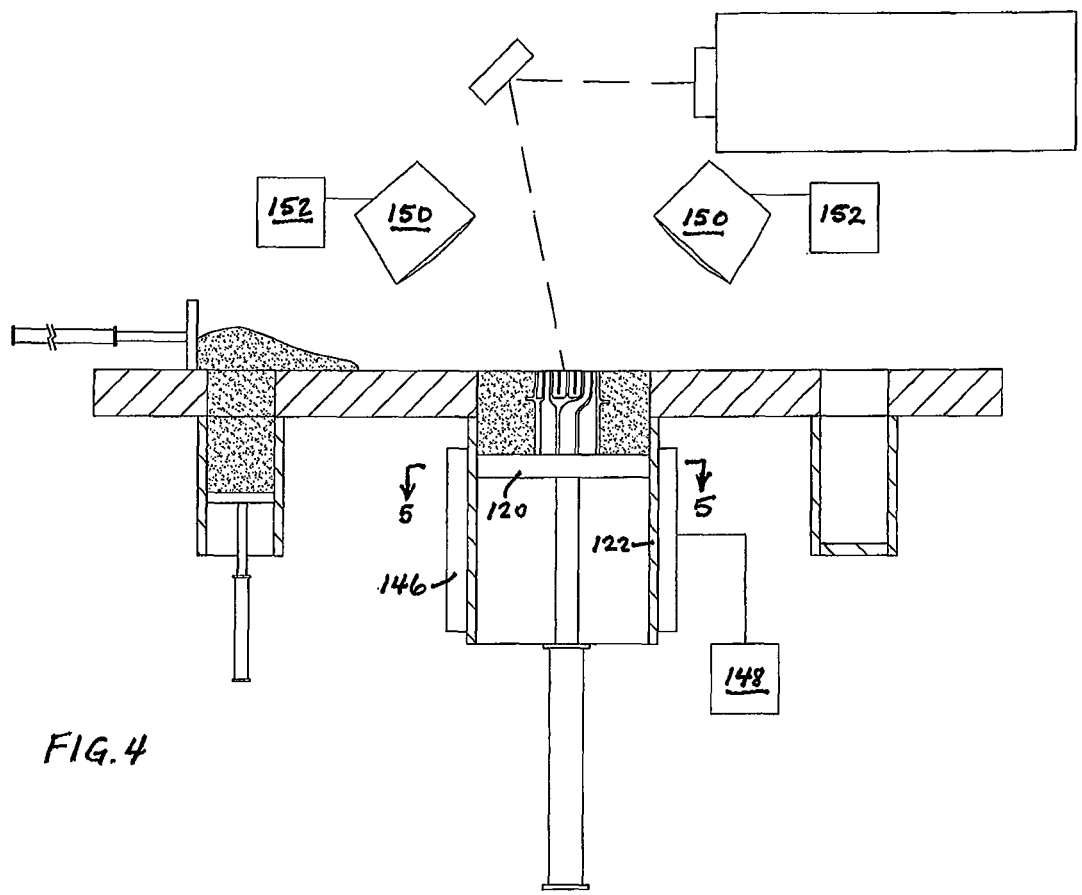
FIG. 4 is partially-sectioned schematic side view of an additive manufacturing apparatus constructed in accordance with an aspect of the present invention.
Figure 5:
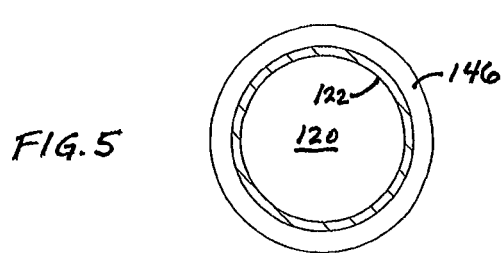
FIG. 5 is a view taken along lines 5-5 of FIG. 4.
Figure 6:
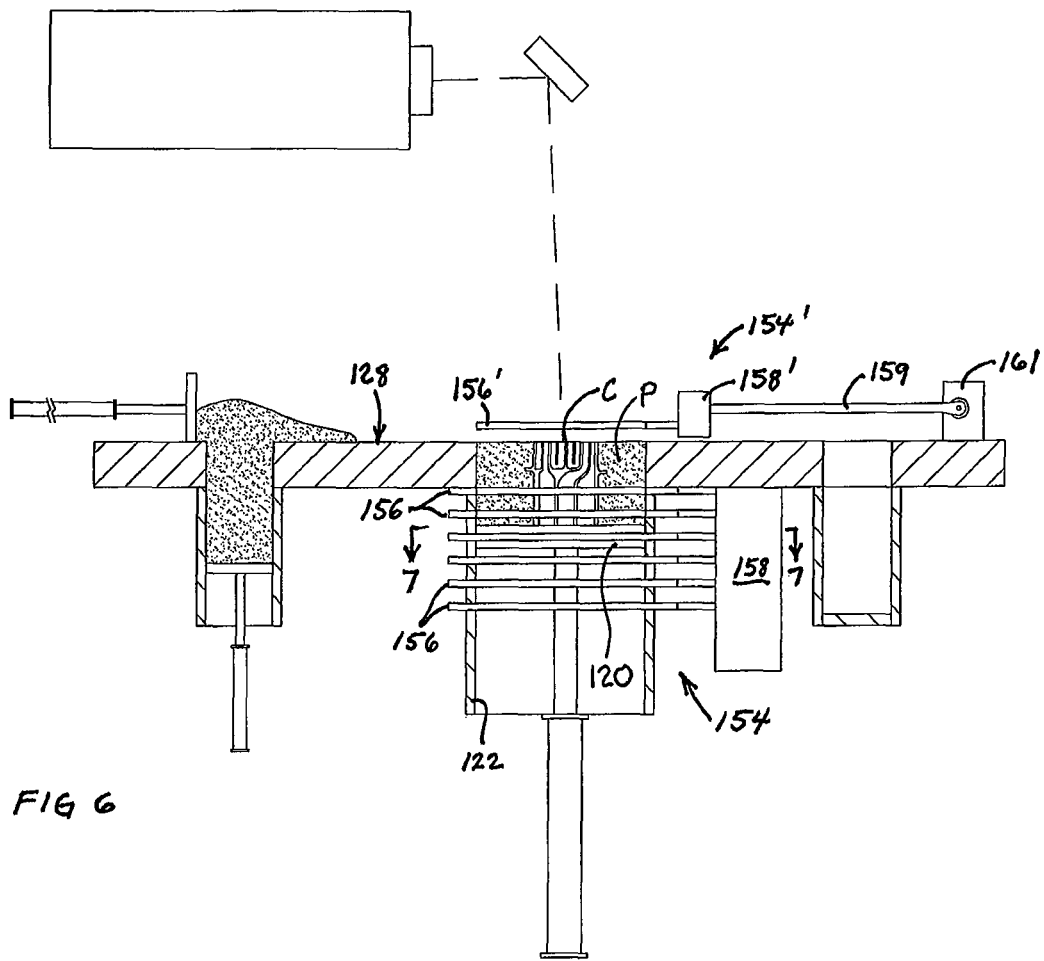
FIG. 6 is partially-sectioned schematic side view of an additive manufacturing apparatus constructed in accordance with an aspect of the present invention.
Figure 7:
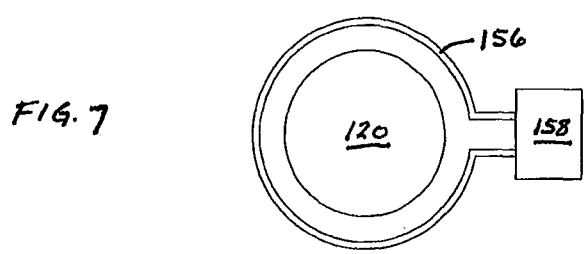
FIG. 7 is a view taken along lines 7-7 of FIG. 6.

FIGS. 4 and 5 illustrate an external heat control apparatus including one or more heaters. A belt-type electric resistance heater 146 is wrapped around the exterior of the build enclosure 122 and connected to an electric power source 148. When active, the heater 146 heats the build enclosure 122 (and therefore the component C inside) through thermal conduction.

Another optional type of external heat control apparatus is a radiation heating source. For example, FIG. 4 shows quartz lamps 150 (also referred to as quartz halogen lamps) arranged with a line-of-sight to the component C and connected to an electric power source 152. Such lamps are commercially available, rated at several thousand watts output each. When active, the quartz lamps 150 heat the component C through radiation heat transfer. The quartz lamps 150 may be used instead of or in addition to the belt heater 146 described above.

Another option for the external heat control apparatus is inductive heating, in which an AC current flowing in an induction coil induces a magnetic field which in turn induces eddy currents in a nearby conductive object, resulting in resistance heating of the object. In the example shown in FIGS. 6 and 7, An induction heater 154 includes one or more individual induction coils 156 surrounding the build platform 120, connected to an electric power source 158. In the illustrated example, multiple induction coils 156 are provided, though a single-turn coil may be sufficient. When active, the induction heater 154 is effective to heat the component C. It has been demonstrated experimentally by the inventors that an external induction heating 154 of this type will preferentially heat the melted/solidified component C within a powder bed without heating the loose powder P sufficiently to cause it to melt or otherwise attach to the component C being built. Components in the vicinity of the coils 156, for example the build platform 120 and the build enclosure 122, must be fabricated from suitable non-conductive materials to avoid heating from the induction heater 154.

Optionally, the apparatus may include another induction heater 154' comprising an induction coil 156' connected to an electric power source 158'. The induction heater 154' is positioned over the build platform 120 and above the worksurface 128 by an arm 159 connected to an actuator 161. The actuator 161 is operable to move the induction heater 154' between the extended or "in-use" position shown in FIG. 6 and a retracted position away from the worksurface 128.

The build process for a single-crystal component "C" using the apparatus described above is as follows. The build platform 120 is moved to an initial high position. A seed element 160 (see FIG. 2) is placed on the build platform 120. The seed element 160 serves as a nucleation point for cooling and has a selected crystallographic structure. If it is desired to manufacture a single-crystal component C, the seed element will have a single-crystal microstructure. Such seed elements 160 can be manufactured by known techniques. Once the seed element 160 is positioned, the build platform 120 is lowered below the worksurface 128 by a selected layer increment. The layer increment affects the speed of the additive manufacturing process and the resolution of the component C. As an example, the layer increment may be about 10 to 50 micrometers (0.0003 to 0.002 in.). Powder "P" is then deposited over the build platform 120 and the seed element 160. For example, the elevator 140 of the supply container 138 may be raised to push powder through the supply opening 132, exposing it above the worksurface 128. The scraper 116 is moved across the worksurface to spread the raised powder P horizontally over the build platform 120. Any excess powder P drops through the overflow opening 134 into the overflow container 118 as the scraper 116 passes from left to right. Subsequently, the scraper 116 may be retracted back to a starting position.

The directed energy source 124 is used to melt a two-dimensional cross-section or layer of the component C being built. The directed energy source 124 emits a beam "B" and the beam steering apparatus 126 is used to steer the focal spot "S" of the beam B over the exposed powder surface in an appropriate pattern. The exposed layer of the powder P is heated by the beam B to a temperature allowing it to melt, flow, and consolidate. This step may be referred to as fusing the powder P.

The build platform 120 is moved vertically downward by the layer increment, and another layer of powder P is applied in a similar thickness. The directed energy source 124 again emits a beam B and the beam steering apparatus 126 is used to steer the focal spot S of the beam B over the exposed powder surface in an appropriate pattern. The exposed layer of the powder P is heated by the beam B to a temperature allowing it to melt, flow, and consolidate both within the top layer and with the lower, previously-solidified layer, again maintaining the crystallographic orientation of the layers below.

This cycle of moving the build platform 120, applying powder P, and then directed energy melting the powder P is repeated until the entire component C is complete.

Maintenance of a single-crystal microstructure throughout the component C requires control of temperature and cooling rates throughout the component C during fabrication. The directed energy heat input is sufficient to maintain required temperatures for the uppermost portion of the component C, near where new layers are actively being laid down, but not for its entire extent. To address this problem, the method of the present invention uses the external heat control apparatus during the cycle of powder deposition and directed energy melting.

The external heat control apparatus is operable to control both the temperature and the heating rate of the entire component C. For example, one known solutioning heat treatment includes the steps of: (1) heating a component to about 1260° C. (2300° F.) for about two hours to homogenize the microstructure, (2) gradually raising the temperature from about 1260° C. (2300° F.) to a solutioning temperature of about 1320° C. (2415° F.) at a rate of about 5.5° C. (10° F.) per hour, then (3) maintaining the component at that temperature for about two hours, followed by (4) cooling to an aging temperature of about 1120° C. (2050° F.) in three minutes or less. The external heat control apparatus is effective to implement the temperature profile needed to carry out this and other heat treatments.

Because the external heat control apparatus is separate from the directed energy source 124, it may also be used for other heat treatment processes, such as aging the component C after the build process is complete. For example, one known aging process involves primary aging the component at the aging temperature for a period of hours to achieve the desired microstructure.

If the optional induction heater 154' is present, it can be used to more directly control remelt and solidification of the component C to maintain its crystallographic orientation and microstructure. During the cycle described above, the induction heater 154' would be moved into the extended position over a freshly directed-energy-melted layer of the component C and activated to heat that layer as desired. If needed the directed energy source 124 could be used to continuously remelt the exposed layer until the induction heater 154' could be moved into position. Once the desired heating cycle is complete the induction heater 154' would be retracted out of the way of the rest of the apparatus so that the next layer of powder P could be applied and directed-energy melted to the layer below.

Figure 8:
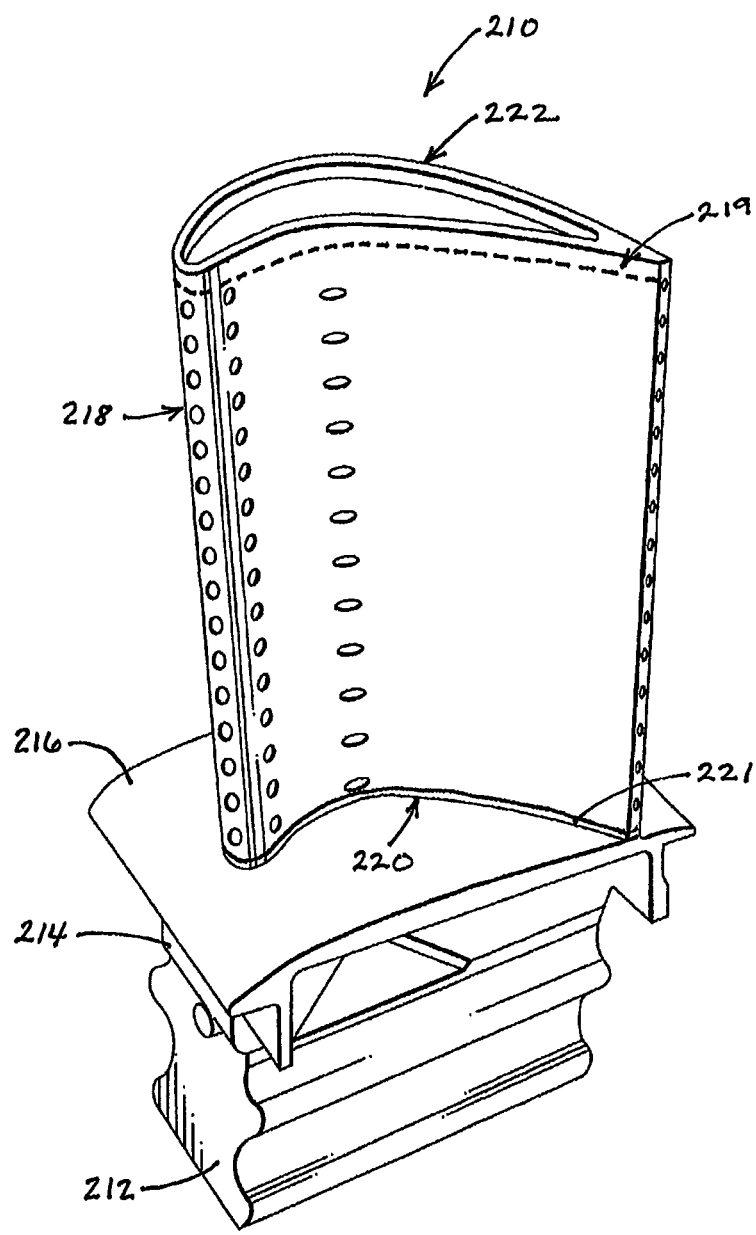
FIG. 8 is a schematic perspective view of an alternative turbine component constructed in accordance with an aspect of the present invention.

The apparatus and method described above may be used to construct all or part of a component in combination with other methods. For example, FIG. 8 illustrates a turbine blade 210 having a dovetail 212, blade shank 214 extending radially upwardly from the dovetail 212 and terminating in a platform 216. A hollow airfoil 218 extends radially outwardly from the platform 216. The airfoil has a root 220 at the junction of the platform 216 and the airfoil 218, and a tip 222 at its radially outer end. The lower portion of the turbine blade 210—that is, the dovetail 212, shank 214, platform 216, and root 220—may be manufactured using a conventional casting process and have a directionally solidified microstructure. The body of the airfoil 218 may be a single-crystal structure constructed using the additive manufacturing process described above. A single-crystal foil 221 placed on the cast lower portion acts as a seed crystal for additive manufacturing process.

The airfoil 218 (or any of the other components C described above) need not have a homogenous alloy composition. The composition may be varied by changing the composition of the powder P during the additive manufacturing process, to produce varying layers or sections of the component C. For example, the airfoil 218 shown in FIG. 8 may have the radially inner portion or body portion (below the dashed line) manufactured with a first alloy composition, and a radially outer portion or tip portion 219 (above the dashed line) manufactured with a second alloy composition different from the first alloy. For example, the alloy used for the tip portion 219 may have greater oxidation resistance than the alloy used for the body portion.

The process described herein has several advantages over the prior art. The additive manufacturing process is much simpler and requires far fewer process steps to produce a component as compared to conventional investment casting. Component yields for this process can be significantly higher than for conventional investment casting, for example in the 90% range versus 65% or less. It also is enabling technology for finer details such as impingement cooling, shaped film holes, turbulator structures, and features that are otherwise "un-castable" or "un-machinable".

The foregoing has described an apparatus and method for layered manufacturing of single crystal alloy components. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends any novel one, or any novel combination, of the features disclosed in this specification (including any accompanying potential points of novelty, abstract and drawings), or to any novel one, or any novel combination, of the steps of any method or process so disclosed.

Further aspects of the invention are provided by the subject matter of the following clauses:

1. A method of making a component, comprising: depositing a metallic powder on a workplane; directing a beam from a directed energy source to fuse the powder in a pattern corresponding to a cross-sectional layer of the component; repeating in a cycle the steps of depositing and fusing to build up the component in a layer-by layer fashion; during the cycle of depositing and melting, using an external heat control apparatus separate from the directed energy source, wherein the external heat control apparatus controls both the temperature and the heating rate of the component during the cycle of depositing and fusing to maintain a predetermined temperature profile of the component, such that the resulting component has a directionally-solidified or single-crystal microstructure; and using a retractable induction heater comprising an induction coil connected to an electric power source to directly control remelt and solidification of the component to maintain its crystallographic orientation and microstructure by: moving the retractable induction heater during the cycle of depositing and melting into an extended position over the workplane and activating to heat an exposed layer of the component, and after completion of the desired heating cycle, moving the retractable induction heater to a retracted position away from the workplane so that a next layer of powder can be applied on the workplane.

2. The method of any preceding clause wherein the directed energy source is used to continuously remelt the exposed layer until the retractable induction heater can be moved into the extended position.

3. The method of any preceding clause wherein the powder and component are supported on a build platform which is moveable along a vertical axis.

4. The method of any preceding clause further comprising lowering the build platform after each step of fusing the powder by a selected layer increment.

5. The method of any preceding clause wherein the external heat control apparatus comprises a layer of thermal insulation surrounding the component.

6. The method of any preceding clause wherein the external heat control apparatus comprises a heater surrounding the component.

7. The method of any preceding clause wherein the external heat control apparatus comprises a quartz lamp positioned near the component.

8. The method of any preceding clause wherein the external heat control apparatus comprises at least one induction coil surrounding the component.

9. The method of any preceding clause wherein the external heat control apparatus is used to maintain the component at a solutioning temperature.

10. The method of any preceding clause, wherein the retractable induction heater is positioned over a build platform and above the workplane by an arm connected to an actuator, and wherein moving the induction heater between the extended and retracted positions is performed using the actuator.

11. The method of any preceding clause, wherein the external heat control apparatus comprises an induction heater including one or more individual induction coils surrounding a build platform and connected to an electric power source, and wherein the induction coils of the retractable induction heater are positioned over the build platform and above the workplane.

12. An apparatus for making a metallic component, comprising: a build enclosure configured to hold metallic powder of a predetermined composition; a directed energy source operable to produce an energy beam suitable for fusing the metallic powder; a beam steering apparatus operable to direct the energy beam over the metallic powder in a pattern corresponding to a cross-sectional layer of the component; an external heat control apparatus separate from the directed energy source, wherein the external heat control apparatus is operable to control both the temperature and the heating rate of the component during depositing and fusing of the metallic powder and to maintain a predetermined temperature profile within the build enclosure; and a retractable induction heater comprising an induction coil connected to an electric power source and mounted above the build enclosure by an arm connected to an actuator, wherein the actuator is operable to move the induction coil between an in-use position and a retracted position away from the build enclosure.

13. The apparatus of any preceding clause further including a build platform disposed inside the build enclosure, the build platform being moveable along a vertical axis.

14. The apparatus of any preceding clause wherein the external heat control apparatus comprises a layer of thermal insulation surrounding the component or wherein the external heat control apparatus comprises a heater surrounding the component.

15. The apparatus of any preceding clause wherein the external heat control apparatus comprises a quartz lamp positioned near the component.

16. The apparatus of any preceding clause wherein the external heat control apparatus comprises at least one induction coil surrounding the build enclosure.

What is claimed is:

1. An apparatus for making a metallic component, comprising:
a build enclosure configured to hold metallic powder of a predetermined composition;
a directed energy source operable to produce an energy beam suitable for fusing the metallic powder;
a beam steering apparatus operable to direct the energy beam over the metallic powder in a pattern corresponding to a cross-sectional layer of the component;
an external heat control apparatus separate from the directed energy source, wherein the external heat control apparatus is operable to control both the temperature and the heating rate of the component during depositing and fusing of the metallic powder and to maintain a predetermined temperature profile within the build enclosure; and
a retractable induction heater comprising an induction coil connected to an electric power source and mounted above the build enclosure by an arm connected to an actuator, wherein the actuator is operable to move the induction coil between an in-use position and a retracted position away from the build enclosure.

2. The apparatus of claim 1 further including a build platform disposed inside the build enclosure, the build platform being moveable along a vertical axis.

3. The apparatus of claim 1 wherein the external heat control apparatus comprises a layer of thermal insulation surrounding the component or wherein the external heat control apparatus comprises a heater surrounding the component.

4. The apparatus of claim 1 wherein the external heat control apparatus comprises a quartz lamp positioned near the component.

5. The apparatus of claim 1 wherein the external heat control apparatus comprises at least one induction coil surrounding the build enclosure.

* * * * *